US012592344B2

(12) United States Patent
Gu et al.

(10) Patent No.: US 12,592,344 B2
(45) Date of Patent: Mar. 31, 2026

(54) STACKED CERAMIC CAPACITOR PACKAGE FOR ELECTRONIC DEVICE

(71) Applicant: AMOTECH CO., LTD., Incheon (KR)

(72) Inventors: Yugyeong Gu, Incheon (KR); Jaewook Lee, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 466 days.

(21) Appl. No.: 18/265,132

(22) PCT Filed: Dec. 2, 2021

(86) PCT No.: PCT/KR2021/018060
§ 371 (c)(1),
(2) Date: Jun. 2, 2023

(87) PCT Pub. No.: WO2022/119330
PCT Pub. Date: Jun. 9, 2022

(65) Prior Publication Data
US 2024/0013979 A1     Jan. 11, 2024

(30) Foreign Application Priority Data

Dec. 3, 2020    (KR) ........................ 10-2020-0167105
Dec. 3, 2020    (KR) ........................ 10-2020-0167503

(51) Int. Cl.
*H01G 4/232*        (2006.01)
*H01G 4/30*         (2006.01)
(Continued)

(52) U.S. Cl.
CPC .............. *H01G 4/232* (2013.01); *H01G 4/38* (2013.01); *H01G 4/40* (2013.01); *H10W 70/40* (2026.01); *H01G 4/30* (2013.01)

(58) Field of Classification Search
CPC ............ H01G 4/232; H01G 4/38; H01G 4/40; H01G 4/30; H01G 2/06; H01G 2/065;
(Continued)

(56) References Cited

U.S. PATENT DOCUMENTS 8,233,265 B2    7/2012   Otsuka et al.
10,262,801 B2   4/2019   Itamochi
(Continued)

FOREIGN PATENT DOCUMENTS

JP        11176695 A   *  7/1999   ............... H01G 4/40
JP        H11-176695 A     7/1999
(Continued)

OTHER PUBLICATIONS

English translation of KR-101774463-B1 (Year: 2017).*
(Continued)

*Primary Examiner* — William B Partridge
*Assistant Examiner* — David Paul Sedorook
(74) *Attorney, Agent, or Firm* — Maschoff Brennan

(57)                 ABSTRACT

Provided is a stacked ceramic capacitor package, for an electronic device, preventing noise, vibration and cracks due to piezoelectric properties. The ceramic capacitor package for an electronic device comprises: stacked ceramic capacitors; a first terminal structure connected to a first side surface of the stacked ceramic capacitors; and a second terminal structure connected to a second side surface of the stacked ceramic capacitors and disposed so as to face the first terminal structure with the stacked ceramic capacitors therebetween. The first terminal structure has a first groove defined in an area coming into contact with the first side surface of the stacked ceramic capacitors. The horizontal length of the first groove is 30% to 50% of the horizontal length of the stacked ceramic capacitors.

14 Claims, 11 Drawing Sheets

(51) Int. Cl.

| | | |
|---|---|---|
| *H01G 4/38* | | (2006.01) |
| *H01G 4/40* | | (2006.01) |
| *H10W 70/40* | | (2026.01) |

(58) Field of Classification Search

CPC ............ H01G 4/012; H01G 2/02; H01G 2/14;
H01G 4/12; H01G 4/1227; H01G 4/224;
H01G 4/228; H01L 23/495; H01L
29/861; H01C 7/10; H10D 8/00

See application file for complete search history.

(56) References Cited

U.S. PATENT DOCUMENTS

| | | | |
|---|---|---|---|
| 10,692,655 B2 | 6/2020 | Beck et al. | |
| 10,804,035 B2 | 10/2020 | Ando et al. | |
| 2015/0116894 A1* | 4/2015 | Fairchild | H01G 4/008 |
| | | | 29/25.03 |
| 2015/0187570 A1* | 7/2015 | Haider | H01L 21/02087 |
| | | | 438/692 |
| 2016/0212843 A1 | 7/2016 | Park et al. | |
| 2017/0005464 A1* | 1/2017 | Hwang | H01R 13/2442 |

| | | | |
|---|---|---|---|
| 2017/0015590 A1* | 1/2017 | Wang | C04B 35/4682 |
| 2017/0301472 A1* | 10/2017 | Fairchild | H01G 4/1227 |
| 2017/0316879 A1 | 11/2017 | Kim et al. | |

FOREIGN PATENT DOCUMENTS

| | | | | |
|---|---|---|---|---|
| JP | 2010-123614 A | 6/2010 | | |
| JP | 2018-018938 A | 2/2018 | | |
| JP | 2018-085425 A | 5/2018 | | |
| KR | 10-2016-0089738 A | 7/2016 | | |
| KR | 101774463 B1 * | 9/2017 | ............. | H01G 2/065 |
| KR | 10-2017-0141631 A | 12/2017 | | |
| KR | 20170141631 A * | 12/2017 | .............. | H01G 2/22 |
| KR | 10-2018-0122127 A | 11/2018 | | |
| WO | 2006/110411 A1 | 10/2006 | | |
| WO | 2017/212070 A1 | 12/2017 | | |

OTHER PUBLICATIONS

English translation JP-11176695-A (Year: 1999).*
English translation JP 11176695 (Year: 1999).*
English translation KR 101774463 (Year: 2017).*
KR Office Action dated May 1, 2024 as received in Application No. 10-2021-0170805.

* cited by examiner

[FIG. 1]
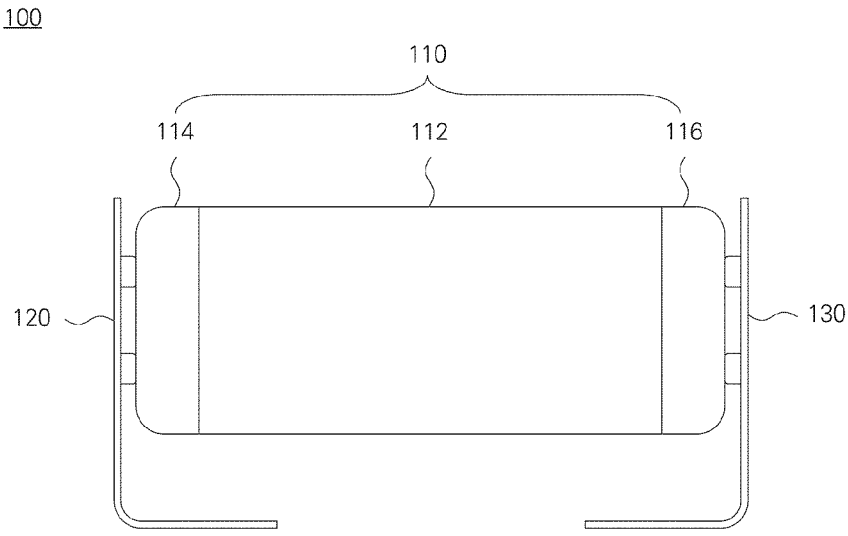
[FIG. 2]
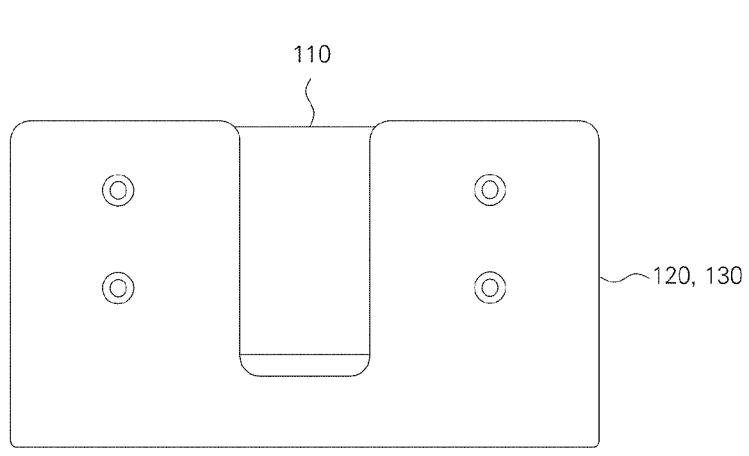

[FIG. 3]
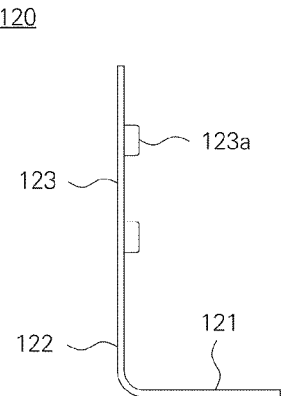
[FIG. 4]
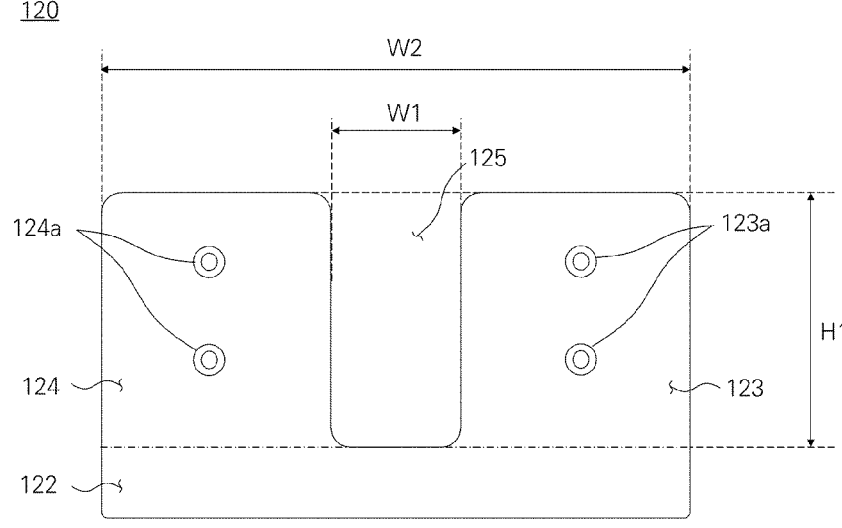

[FIG. 5]
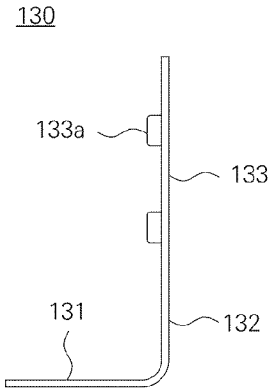
[FIG. 6]
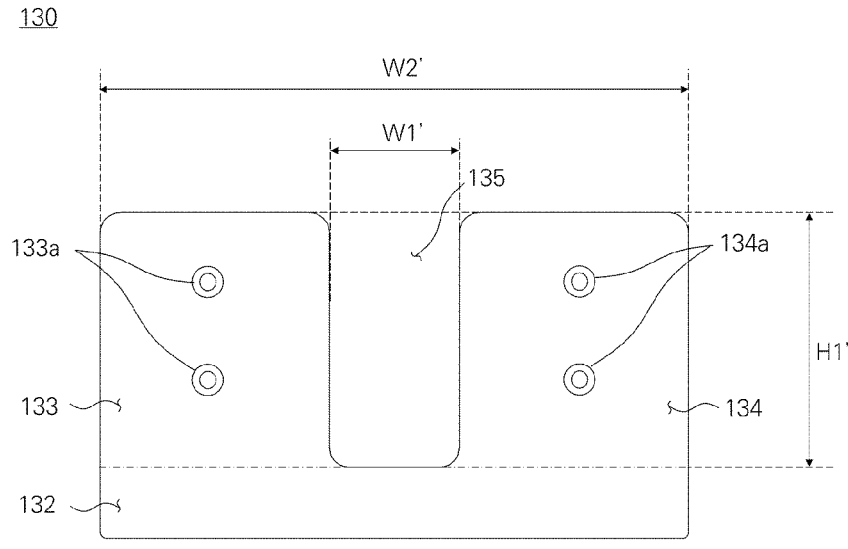

[FIG. 7]
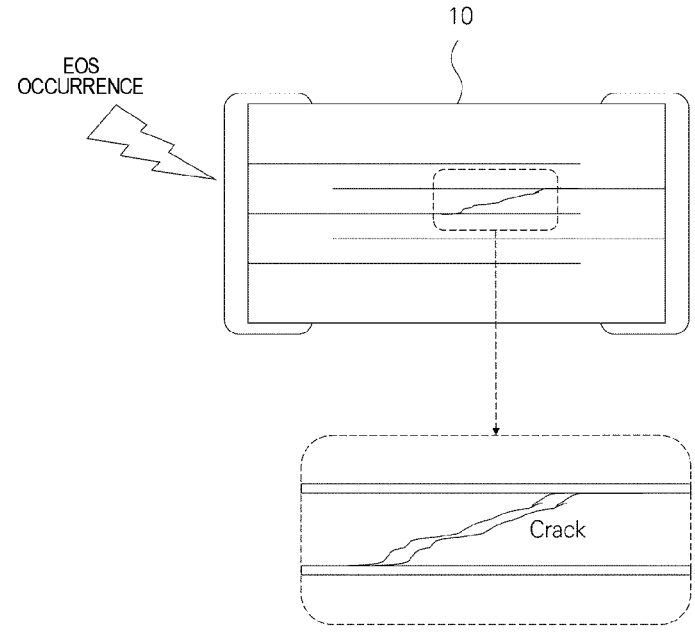
[FIG. 8]
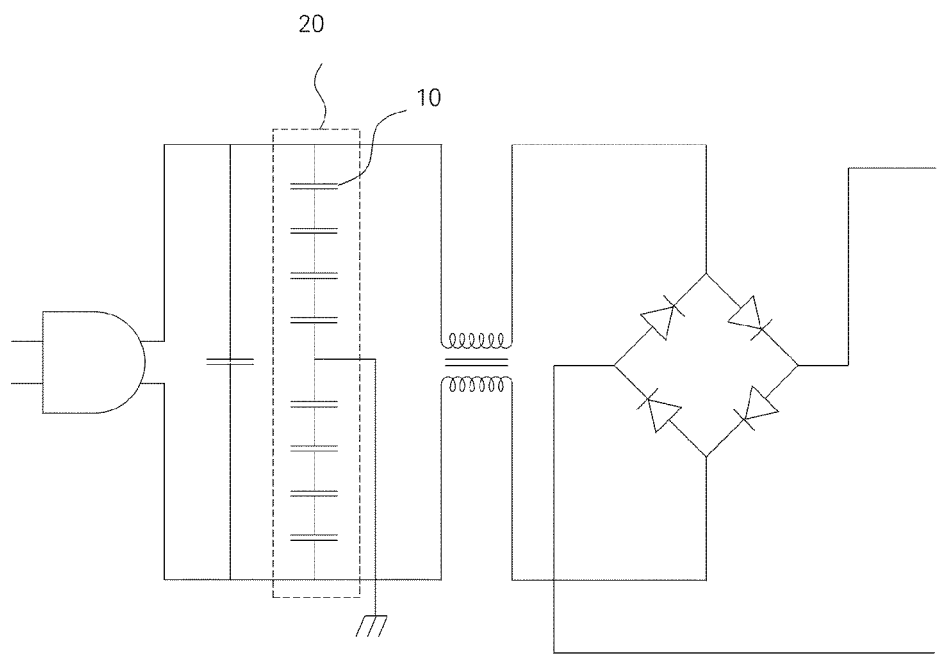

[FIG. 9]
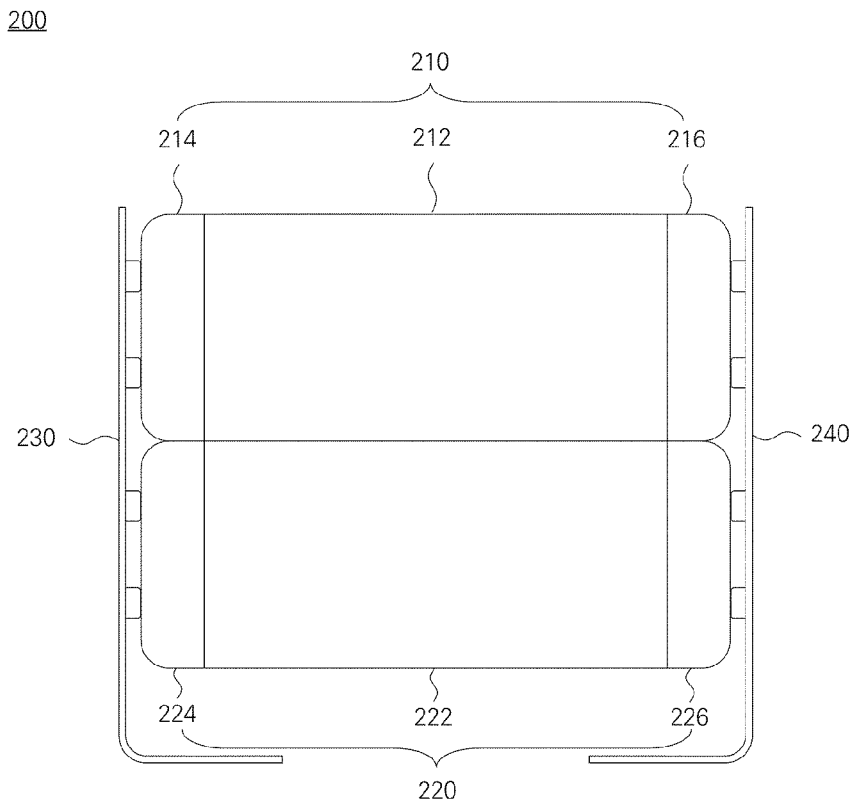

[FIG. 10]
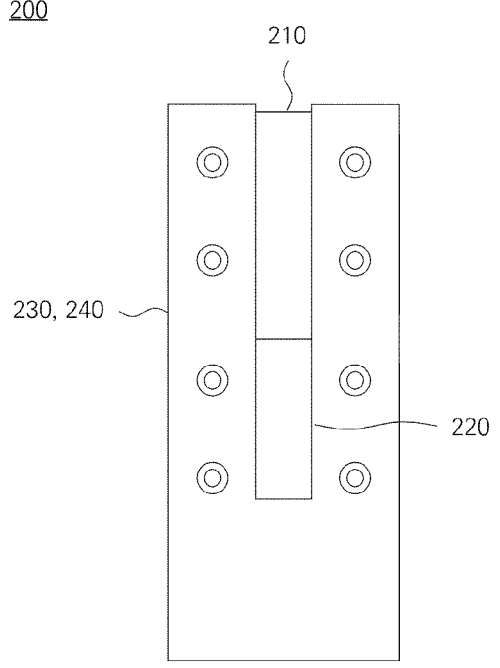
[FIG. 11]
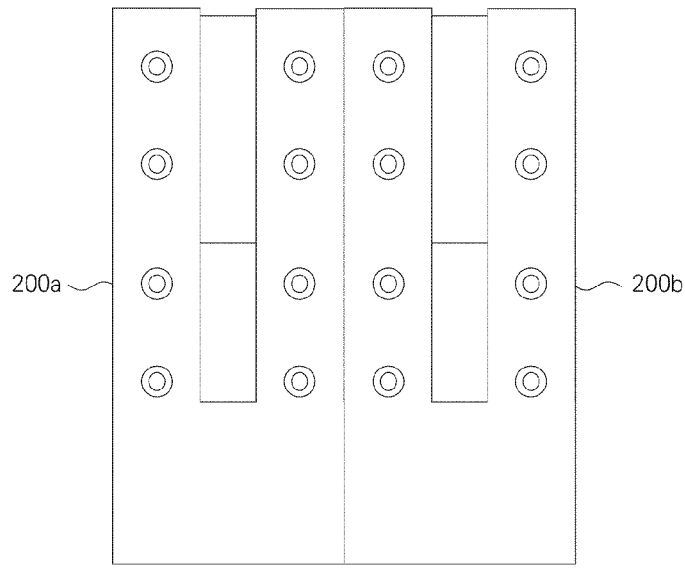

[FIG. 12]

| OPTION | | USED PRODUCT | EOS WITHSTAND VOLTAGE |
|---|---|---|---|
| 1 | | CONVENTIONAL STACKED CERAMIC CAPACITOR 1ea | 700 |
| | | | 770 |
| | | | 700 |
| 2 | | CONVENTIONAL STACKED CERAMIC CAPACITOR 2ea | 1700 |
| | | | 1800 |
| | | | 1700 |
| 3 | | CONVENTIONAL STACKED CERAMIC CAPACITOR 3ea | 2800 |
| | | | 2600 |
| | | | 2800 |
| 4 | | STACKED CERAMIC CAPACITOR PACKAGE 1ea(varistor 140 pF) | 3000 |
| | | | 2800 |
| | | | 3000 |
| 5 | | STACKED CERAMIC CAPACITOR PACKAGE 2ea(varistor 140 pF) | 2700 |
| | | | 3000 |
| | | | 3000 |
| 6 | | STACKED CERAMIC CAPACITOR PACKAGE 2ea(varistor 10 pF) | 1800 |
| | | | 2000 |
| | | | 2000 |

[FIG. 13]
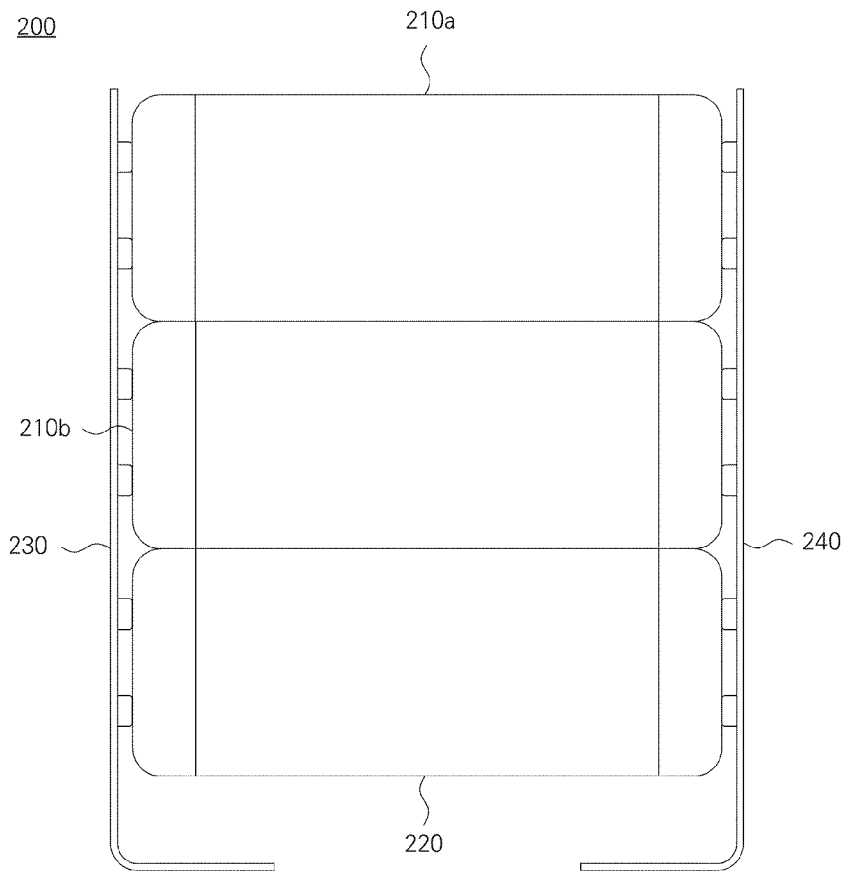

[FIG. 14]
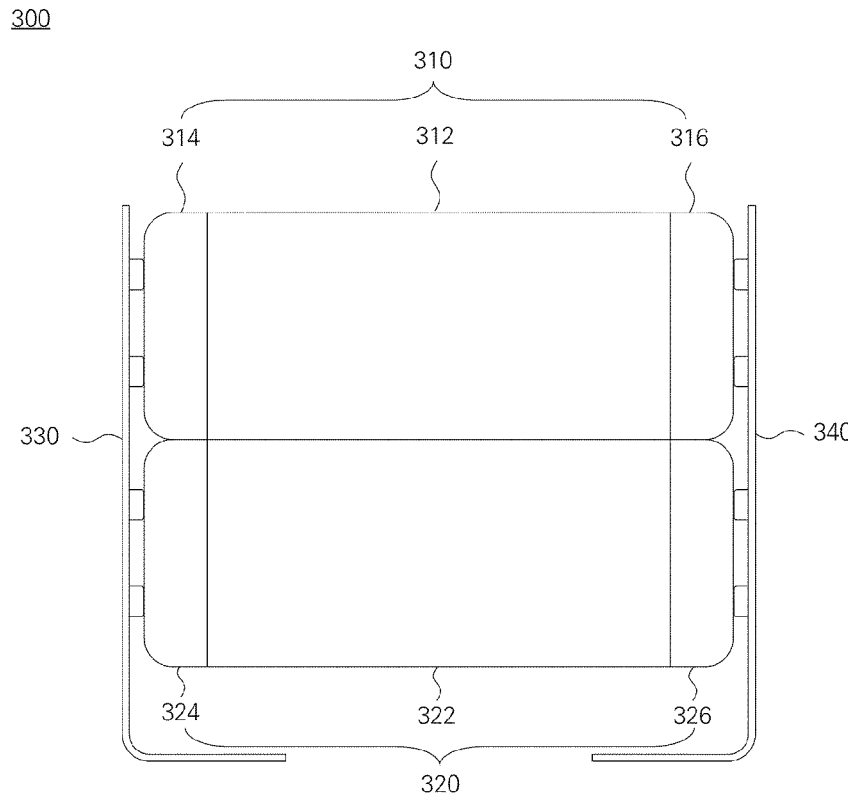

[FIG. 15]
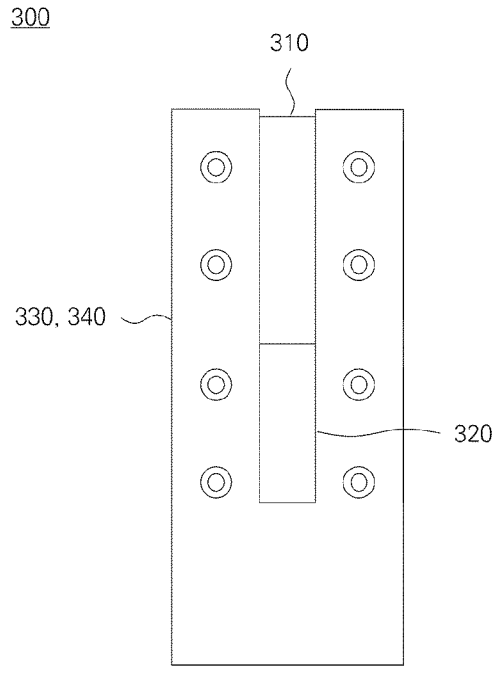
[FIG. 16]
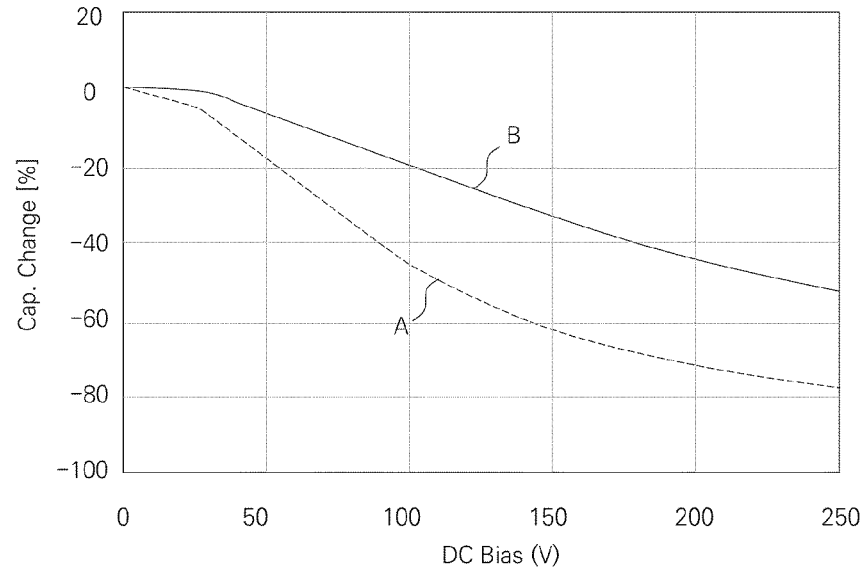

[FIG. 17]
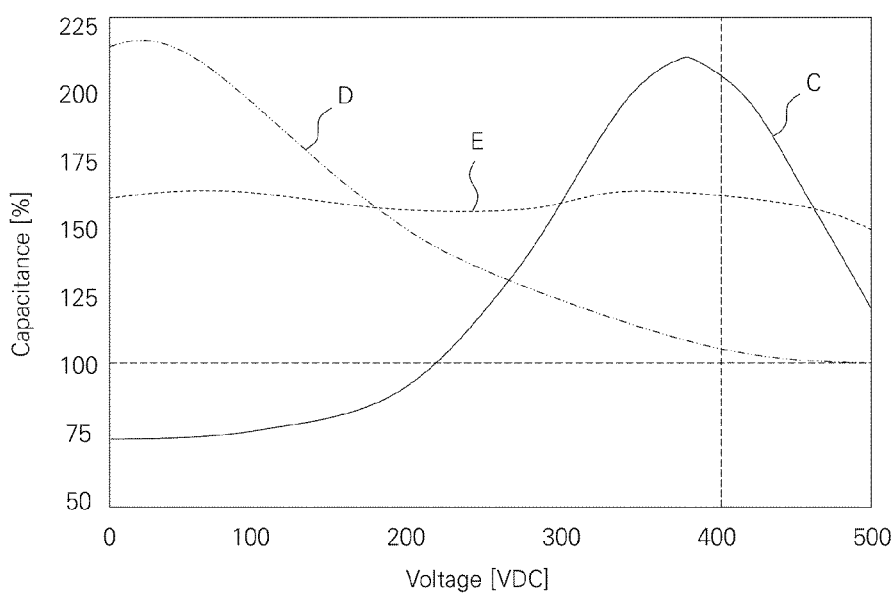

STACKED CERAMIC CAPACITOR PACKAGE FOR ELECTRONIC DEVICE

TECHNICAL FIELD

The present disclosure relates to a capacitor, and more particularly, to a stacked ceramic capacitor mounted on a vehicle.

BACKGROUND ART

An on board charger (OBC) module that boosts external AC power and converts DC power when a battery is slowly charged is mounted on electric vehicles and hybrid electric vehicles. In this case, a stacked ceramic capacitor is additionally mounted on the electric vehicles and the hybrid electric vehicles to remove electromagnetic interference (EMI) noise generated at a power inlet of the OBC module.

In the case of the OBC module used in the electric vehicle, when EOS or the like generated during charging of a battery flows into a circuit, problems such as a short circuit of a stacked ceramic capacitor being used occur, resulting in circuit failure and fire hazard.

Conventionally, in order to solve the short circuit problem caused by a withstand voltage problem of the EOS, 4 to 5 stacked ceramic capacitors are connected in series to increase a withstand voltage or a circuit protection method of separately adding an EOS protection device such as a varistor or a TVS diode to a front end portion of a circuit is adopted, thereby minimizing EOS damage.

When such a circuit configuration is taken, there is a problem in that the overall volume of the circuit increases and the circuit design cost increases.

In addition, in the automobile industry, as the voltage used in the electric vehicle gradually increases, stacked ceramic capacitors having capacitance characteristics with a low rate of change are required.

However, the stacked ceramic capacitors are difficult to implement high capacitance when implementing capacitance characteristics, and thus are mainly used for low capacitance application circuits.

In EV powertrain applications that require high capacity and high voltage characteristics, it is difficult for a stacked ceramic capacitor made of a ferroelectric material such as an X7R material to have a uniform capacitance value in a wide voltage range due to the characteristics that effective capacitance decreases when a voltage increases, and as a result, there is a problem in that the effect of reducing ripple of a power line and power noise is reduced.

In addition, stacked ceramic capacitors made of a paraelectric material such as COG or U2J having a small rate of change in effective capacitance have a low dielectric constant, thereby making it difficult to implement high capacitance.

In addition, since a plurality of stacked ceramic capacitors made of a paraelectric material should be connected in parallel to realize high capacitance, there is a problem in that the overall volume of the circuit increases when the stacked ceramic capacitors are applied to the circuit.

Matters described in the above background art are intended to help the understanding of the background of the invention, and may include matters that are not the disclosed related art.

SUMMARY OF INVENTION

Technical Problem

The present disclosure has been made in efforts to solve the above problem, and an object of the present disclosure is to provide a stacked ceramic capacitor package for an electronic device to prevent noise, vibration, and cracks due to piezoelectric properties. In addition, the present disclosure has been made in efforts to solve the above problem, and another object of the present disclosure is to provide a stacked ceramic capacitor package for an electronic device that has resistance from an inrush current, EOS, or the like that may be generated at a power inlet through a composite structure.

In addition, another object of the present disclosure is to provide a stacked ceramic capacitor package for an electronic device that has resistance to EOS as a single product without applying multiple components.

Meanwhile, an object of the present disclosure is to provide a high-capacity stacked ceramic capacitor package for an electronic device having stable capacitance and excellent DC bias characteristics in a wide voltage range. That is, recently released electric vehicles require constant capacitance characteristics in a voltage range of about 12V to 400V, and hybrid electric vehicles require constant capacitance characteristics in a voltage range of about 250V to 800V. Accordingly, an object of the present disclosure provides a high-capacity stacked ceramic capacitor package for an electronic device having stable effective capacitance characteristics in a wide operating voltage range.

Solution to Problem

In order to achieve the object, according to features of the present disclosure, a stacked ceramic capacitor package includes: a stacked ceramic capacitor; a first terminal structure connected to a first side surface of the stacked ceramic capacitor; and a second terminal structure connected to a second side surface of the stacked ceramic capacitor and disposed to face the first terminal structure with the stacked ceramic capacitor therebetween, in which the first terminal structure has a first groove defined in an area coming into contact with the first side surface of the stacked ceramic capacitors, and a horizontal length of the first groove is 30% or more to 50% or less of a horizontal length of the stacked ceramic capacitors.

The first terminal structure may include: a first horizontal plate disposed on a lower surface of the stacked ceramic capacitor and spaced apart from a lower surface of the stacked ceramic capacitor; a first vertical plate having a first end portion connected to the first horizontal plate, bent in an upper direction where the stacked ceramic capacitor is disposed, and disposed so that a second end portion is under the stacked ceramic capacitor; a first extension plate extending upward from a second end portion of the first vertical plate and coming into contact with a first area of the first side surface of the stacked ceramic capacitor; and a second extension plate extending upward from the second end portion of the first vertical plate, spaced apart from the first extension plate, and coming into contact with a second area of the first side surface of the stacked ceramic capacitor, and the first groove may be defined as a separation space between the first extension plate and the second extension plate, and is configured to expose a portion of the first side surface of the stacked ceramic capacitor.

A separation distance between the first extension plate and the second extension plate may be 30% or more and 50% or less of a length of the second end portion of the first vertical plate. The first extension plate and the second extension plate may include one or more contact protrusions formed on one surface facing the first side surface of the stacked ceramic capacitor.

A vertical length of the first groove may exceed a vertical length of the stacked ceramic capacitor.

The second terminal structure may have a second groove defined in an area coming into contact with the second side surface of the stacked ceramic capacitor, and a horizontal length of the second groove may be 30% or more to 50% or less of the horizontal length of the stacked ceramic capacitors. The second terminal structure may include: a second horizontal plate disposed on a lower surface of the stacked ceramic capacitor and spaced apart from a lower surface of the stacked ceramic capacitor; a second vertical plate having a first end portion connected to the second horizontal plate, bent in an upper direction where the stacked ceramic capacitor is disposed, and disposed so that a second end portion is under the stacked ceramic capacitor; a third extension plate extending upward from a second end portion of the second vertical plate and coming into contact with a first area of the second side surface of the stacked ceramic capacitor; and a fourth extension plate extending upward from the second end portion of the second vertical plate, spaced apart from the third extension plate, and coming into contact with a second area of the second side surface of the stacked ceramic capacitor, and the second groove may be defined as a separation space between the third extension plate and the fourth extension plate, and may be configured to expose a portion of the second side surface of the stacked ceramic capacitor.

A separation distance between the third extension plate and the fourth extension plate may be 30% or more and 50% or less of a length of the second end portion of the second vertical plate. In this case, the third extension plate and the fourth extension plate may include one or more contact protrusions formed on one surface facing the second side surface of the stacked ceramic capacitor.

The stacked ceramic capacitor package may further include: a protection element disposed under the stacked ceramic capacitor and having a first side surface coming into contact with the first terminal structure and a second side surface coming into contact with the second terminal structure. In this case, the protection element may be one of a varistor and a TVS diode.

The stacked ceramic capacitor package may further include: a first external terminal disposed on the first side surface of the stacked ceramic capacitor and a connection electrode connected to the first external electrode disposed on the first side surface of the protection element.

The stacked ceramic capacitor may include: a first stacked ceramic capacitor made of a first material and having a first side surface coming into contact with the first terminal structure and a second side surface coming into contact with the second terminal structure; and a second stacked ceramic capacitor made of a second material, disposed under the first stacked ceramic capacitor, and having a first side surface coming into contact with the first terminal structure and a second side surface coming into contact with the second terminal structure. In this case, the first material may be one of an X7T material and a PLZT material, and the second material may be the other of the X7T material and the PLZT material.

The stacked ceramic capacitor package may further include: a connection electrode externally connecting a second external terminal of the first stacked ceramic capacitor and a second external electrode of the first stacked ceramic capacitor.

Advantageous Effects of Invention

According to the present disclosure, a stacked ceramic capacitor package may prevent noise, vibration, and cracks due to piezoelectric properties.

In addition, the stacked ceramic capacitor package may stably mount a stacked ceramic capacitor on a circuit board while minimizing piezoelectric noise transmitted to the circuit board.

In addition, the stacked ceramic capacitor package may prevent cracks of the stacked ceramic capacitor due to piezoelectric vibration by minimizing a bonding area between a terminal structure and the stacked ceramic capacitor.

In addition, the stacked ceramic capacitor package is arranged so that a groove of the terminal structure and a lower surface of the stacked ceramic capacitor are spaced apart from each other, thereby preventing cracks (breaking phenomenon) due to the vibration noise of the stacked ceramic capacitor caused by high pressure/temperature.

In addition, the stacked ceramic capacitor package for an electronic device includes an EOS protection function, and thus, may be used stably even in an environment where an inrush current and EOS occur.

In addition, as the stacked ceramic capacitor package for an electronic device is composed of a single product without applying multiple components, the use of additional elements in the corresponding circuit is unnecessary, thereby minimizing a mounting area.

In addition, the stacked ceramic capacitor package for an electronic device may provide stable effective capacitance characteristics in an environment requiring a wide voltage range, such as an electric vehicle or a hybrid electric vehicle.

In addition, the stacked ceramic capacitor package for an electronic device is a high-capacity ceramic capacitor having effective capacitance characteristics and may be applied to a power line with a wide operating voltage, such as an electric vehicle power train.

In addition, the stacked ceramic capacitor package for an electronic device may enable stable characteristics by minimizing variables that may cause ripple of a power line and power noise.

BRIEF DESCRIPTION OF DRAWINGS

FIGS. 1 and 2 are diagrams for describing a stacked ceramic capacitor package for an electronic device according to a first embodiment of the present disclosure.

FIGS. 3 and 4 are diagrams for describing a first terminal structure of FIG. 1.

FIGS. 5 and 6 are diagrams for describing a second terminal structure of FIG. 1.

FIGS. 7 and 8 are diagrams for describing a typical stacked ceramic capacitor.

FIGS. 9 and 10 are diagrams for describing a stacked ceramic capacitor package for an electronic device according to a second embodiment of the present disclosure.

FIG. 11 is a diagram for describing an example in which the stacked ceramic capacitor package for an electronic device according to the second embodiment of the present disclosure is mounted on a circuit board.

FIG. 12 is a diagram for comparing and describing EOS withstand voltage characteristics of the stacked ceramic capacitor package for an electronic device according to the second embodiment of the present disclosure and the conventional stacked ceramic capacitor.

FIG. 13 is a diagram for describing a modified example of the stacked ceramic capacitor package for an electronic device according to the second embodiment of the present disclosure.

FIGS. 14 and 15 are diagrams for describing a stacked ceramic capacitor package for an electronic device according to a third embodiment of the present disclosure.

FIGS. 16 and 17 are diagrams for describing capacitance characteristics of the stacked ceramic capacitor package for an electronic device according to the third embodiment of the present disclosure.

DESCRIPTION OF EMBODIMENTS

Hereinafter, preferred embodiments of the present disclosure will be described in detail with reference to the accompanying drawings.

Embodiments of the present disclosure will be provided only in order to further completely describe the present disclosure to those skilled in the art, the following embodiments may be modified into several other forms, and the scope of the present disclosure is not limited to the following embodiments. Rather, these embodiments make the present disclosure thorough and complete, and are provided in order to completely transfer the spirit of the present disclosure.

Terms used in the present specification are used in order to describe a specific embodiment, and are not to limit the present disclosure. In addition, in the present specification, a singular form may include plural forms unless explicitly described otherwise.

In the description of the embodiment, when each layer (film), a region, a pattern, or structures are described as being formed "on" or "under" a substrate, each layer (film), a region, a pad, or a pattern, "on" and "under" include both "directly" or "indirectly" formed through another layer. In addition, in principle, standards for the upper or lower of each layer are based on the drawings.

The drawings are only for understanding the spirit of the present disclosure, and should not be construed as limiting the scope of the present disclosure by the drawings. In addition, the relative thickness, length, or relative size in the drawings may be exaggerated for convenience and clarity of description.

Referring to FIGS. 1 and 2, a stacked ceramic capacitor 110 package 100 for an electronic device according to a first embodiment of the present disclosure is configured to include a stacked ceramic capacitor 110, a first terminal structure 120, and a second terminal structure 130.

The stacked ceramic capacitor 110 (MLCC) includes a main body 112 formed in a rectangular parallelepiped having an upper surface, a lower surface, a front surface, a rear surface, a left side surface, and a right side surface, a first external terminal 114 formed on the left side surface of the main body 112, and a second external terminal 116 formed on the right side surface of the main body 112. A plurality of internal electrodes are stacked inside the main body 112, and each internal electrode is connected to one of the first external terminal 114 and the second external terminal 116. The first external terminal 114 and the second external terminal 116 may also be partially formed on the upper surface, lower surface, front surface, and rear surface of the main body 112. In this case, the first external terminal 114 and the second external terminal 116 are spaced apart from each other by a predetermined distance so as to face each other on the upper surface, lower surface, front surface, and rear surface of the main body 112.

The first terminal structure 120 is disposed on the left side of the stacked ceramic capacitor 110 and comes into contact with the first external terminal 114 of the stacked ceramic capacitor 110. The first terminal structure 120 comes into contact with an area formed on the left side surface of the main body 112 among the first external terminals 114.

Referring to FIGS. 3 and 4, the first terminal structure 120 is configured to include a first horizontal plate 121, a first vertical plate 122, a first extension plate 123, and a second extension plate 124.

The first horizontal plate 121 is disposed on the lower surface of the stacked ceramic capacitor 110. The first horizontal plate 121 is spaced apart from the lower surface of the stacked ceramic capacitor 110 by a predetermined distance. The first horizontal plate 121 comes into contact with a terminal of a circuit board when the stacked ceramic capacitor 110 package 100 for an electronic device is mounted on a circuit board mounted on a vehicle.

In this case, a first end portion of the first horizontal plate 121 is disposed at a position spaced apart from the lower surface of the stacked ceramic capacitor 110 by a predetermined distance. A second end portion of the first horizontal plate 121 is disposed at a position spaced apart from the lower surface of the stacked ceramic capacitor 110 by a predetermined distance, and is disposed on the same line as the left side surface of the stacked ceramic capacitor 110.

The first vertical plate 122 is disposed in a direction of the left side surface of the stacked ceramic capacitor 110.

The first end portion of the first vertical plate 122 is connected to the second end portion of the first horizontal plate 121. The first vertical plate 122 is bent upward from the first end portion. Accordingly, the first vertical plate 122 is disposed to form an angle of about 90° with respect to the first horizontal plate 121.

The second end portion of the first vertical plate 122 is disposed under the lower surface of the stacked ceramic capacitor 110. When looking at the left side surface of the stacked ceramic capacitor 110 package 100 for an electronic device, the second end portion of the first vertical plate 122 is disposed at a position lower than the lower surface of the stacked ceramic capacitor 110 and spaced apart from the lower surface of the stacked ceramic capacitor 110 by a predetermined distance.

The first extension plate 123 is connected to the second end portion of the first vertical plate 122. The first extension plate 123 extends upward from the second end portion of the first vertical plate 122 and is disposed on the left side surface of the stacked ceramic capacitor 110. The first extension plate 123 is disposed on the left side surface of the stacked ceramic capacitor 110 and comes into contact with the first external terminal 114.

The first extension plate 123 is disposed to be biased toward the front surface of the stacked ceramic capacitor 110 and comes into contact with a portion of the first external terminal 114. One or more first contact protrusions 123*a* may be formed on the surface of the first extension plate 123 facing the left side surface of the stacked ceramic capacitor 110. The first extension plate 123 comes into contact with the first external terminal 114 through a first contact protrusion 123*a*. Here, the first extension plate 123 may come into contact with the first external terminal 114 through surface contact without forming the first contact protrusion 123*a*.

The second extension plate 124 is connected to the second end portion of the first vertical plate 122. The second extension plate 124 extends upward from the second end portion of the first vertical plate 122 and is disposed on the left side surface of the stacked ceramic capacitor 110. The second extension plate 124 is disposed on the left side surface of the stacked ceramic capacitor 110 and is spaced apart from with the first extension plate 123.

The second extension plate 124 is disposed to be biased toward the rear surface of the stacked ceramic capacitor 110 and comes into contact with the other portion of the first external terminal 114. One or more second contact protrusions 124a may be formed on the surface of the second extension plate 124 facing the left side surface of the stacked ceramic capacitor 110. The second extension plate 124 comes into contact with the first external terminal 114 through the second contact protrusion 124a. Here, the second extension plate 124 may come into contact with the first external terminal 114 through surface contact without forming the second contact protrusion 124a.

As the first extension plate 123 and the second extension plate 124 are spaced apart from each other, the first terminal structure 120 has the first groove 125 defined by the first vertical plate 122, the first extension plate 123, and the second extension plate 124.

A horizontal length W1 of the first groove 125 is formed to be 30% or more and 50% or less of a length W2 of the second end portion of the first vertical plate 122. The horizontal length W1 of the first groove 125 may be formed to be 30% or more and 50% or less of the width of the stacked ceramic capacitor 110 supported by the first terminal structure 120.

In other words, the separation distance (i.e., the horizontal length W1 of the first groove 125) between the first extension plate 123 and the second extension plate 124 is formed to be 30% or more to 50% or less of the length of the second end portion of the first vertical plate 122.

In this case, the vertical length (H1, i.e., height) of the first groove 125 is formed to be longer than the vertical length (height) of the stacked ceramic capacitor 110. Accordingly, when looking at the left side surface of the stacked ceramic capacitor 110 package, a lower portion of the first groove 125 is spaced apart from the lower surface of the stacked ceramic capacitor 110 by a predetermined distance. Through this, the stacked ceramic capacitor 110 package may prevent cracks (breaking phenomenon) due to vibration noise of the stacked ceramic capacitor 110 due to high pressure/high temperature.

The second terminal structure 130 is disposed on the right side of the stacked ceramic capacitor 110 and comes into contact with the second external terminal 116 of the stacked ceramic capacitor 110. The second terminal structure 130 comes into contact with an area formed on the right side surface of the main body 112 among the second external terminals 116.

Referring to FIGS. 5 and 6, the second terminal structure 130 is configured to include a second horizontal plate 131, a second vertical plate 132, a third extension plate 133, and a fourth extension plate 134.

The second horizontal plate 131 is disposed on the lower surface of the stacked ceramic capacitor 110. The second horizontal plate 131 is spaced apart from the lower surface of the stacked ceramic capacitor 110 by a predetermined distance. The second horizontal plate 131 comes into contact with other terminals of a circuit board when the stacked ceramic capacitor 110 package 100 for an electronic device is mounted on a circuit board mounted on a vehicle.

A first end portion of the second horizontal plate 131 is disposed at a position spaced apart from the lower surface of the stacked ceramic capacitor 110 by a predetermined distance. In this case, the first end portion of the first horizontal plate 121 is spaced apart from the first end portion of the second horizontal plate 131 by a predetermined distance.

A second end portion of the second horizontal plate 131 is disposed at a position spaced apart from the lower surface of the stacked ceramic capacitor 110 by a predetermined distance, and is disposed on the same line as the right side surface of the stacked ceramic capacitor 110.

The second vertical plate 132 is disposed in a direction of the right side surface of the stacked ceramic capacitor 110.

The first end portion of the second vertical plate 132 is connected to the second end portion of the second horizontal plate 131. The second vertical plate 132 is bent upward from the first end portion. Accordingly, the second vertical plate 132 is disposed to form an angle of about 90° with respect to the second horizontal plate 131.

The second end portion of the second vertical plate 132 is disposed under the lower surface of the stacked ceramic capacitor 110. When looking at the right side surface of the stacked ceramic capacitor 110 package 100 for an electronic device, the second end portion of the second vertical plate 132 is disposed at a position lower than the lower surface of the stacked ceramic capacitor 110 and spaced apart from the lower surface of the stacked ceramic capacitor 110 by a predetermined distance.

The third extension plate 133 is connected to the second end portion of the second vertical plate 132. The third extension plate 133 extends upward from the second end portion of the second vertical plate 132 and is disposed on the right side surface of the stacked ceramic capacitor 110. The third extension plate 133 is disposed on the right side surface of the stacked ceramic capacitor 110 and comes into contact with the second external terminal 116.

The third extension plate 133 is disposed to be biased toward the front surface of the stacked ceramic capacitor 110 and comes into contact with a portion of the second external terminal 116. One or more third contact protrusions 133a may be formed on the surface of the third extension plate 133 facing the right side surface of the stacked ceramic capacitor 110. The third extension plate 133 comes into contact with the second external terminal 116 through the third contact protrusion 133a. Here, the third extension plate 133 may come into contact with the second external terminal 116 through surface contact without forming the third contact protrusion 133a.

The fourth extension plate 134 is connected to the second end portion of the second vertical plate 132. The fourth extension plate 134 extends upward from the second end portion of the second vertical plate 132 and is disposed on the right side surface of the stacked ceramic capacitor 110. The fourth extension plate 134 is disposed on the right side surface of the stacked ceramic capacitor 110 and is spaced apart from the third extension plate 133.

The fourth extension plate 134 is disposed to be biased toward the rear surface of the stacked ceramic capacitor 110 and comes into contact with a portion of the second external terminal 116. One or more fourth contact protrusions may be formed on the surface of the fourth extension plate 134 facing the right side surface of the stacked ceramic capacitor 110. The fourth extension plate 134 comes into contact with the second external terminal 116 through the fourth contact protrusion. Here, the fourth extension plate 134 may come into contact with the second external terminal 116 through surface contact without forming the fourth contact protrusion.

As the third extension plate 133 and the fourth extension plate 134 are spaced apart from each other, the second terminal structure 130 has a second groove 135 defined by the second vertical plate 132, the third extension plate 133, and the fourth extension plate 134.

A horizontal length W1' of the second groove 135 is formed to be 30% or more and 50% or less of a length W2' of the second end portion of the second vertical plate 132. The horizontal length W1' of the second groove 135 may be formed to be 30% or more and 50% or less of the width of the stacked ceramic capacitor 110 supported by the second terminal structure 130.

In other words, the separation distance (i.e., the horizontal length W1' of the second groove 135) between the third extension plate 133 and the fourth extension plate 134 is formed to be 30% or more to 50% or less of the length of the second end portion of the second vertical plate 132.

In this case, a vertical length (H1', i.e., height) of the second groove 135 is formed to be longer than the vertical length (height) of the stacked ceramic capacitor 110. Accordingly, when looking at the right side surface of the stacked ceramic capacitor 110 package, a lower portion of the second groove 135 is spaced apart from the lower surface of the stacked ceramic capacitor 110 by a predetermined distance. Through this, the stacked ceramic capacitor 110 package may prevent cracks (breaking phenomenon) due to vibration noise of the stacked ceramic capacitor 110 due to high pressure/high temperature.

Referring to FIGS. 7 and 8, since a general stacked ceramic capacitor 10 does not have resistance to EOS, when the EOS flows in while mounted on a vehicle, a short circuit (i.e., an internal short circuit) occurs inside, and cracks occur due to the short circuit occurring inside. Accordingly, the stacked ceramic capacitor 10 is composed of an array 20 in which a plurality of stacked ceramic capacitors 10 are connected in series, and is mounted on a vehicle.

Referring to FIGS. 9 and 10, a stacked ceramic capacitor package 200 for an electronic device according to a second embodiment of the present disclosure is configured to include a stacked ceramic capacitor 210, a protection device 220, a first terminal structure 230, and a second terminal structure 240.

The stacked ceramic capacitor 210 (MLCC) includes a first main body 212 formed in a rectangular parallelepiped having an upper surface, a lower surface, a front surface, a rear surface, a left side surface, and a right side surface, a first external terminal 214 formed on the left side surface of the first main body 212, and a second external terminal 216 formed on the right side surface of the first main body 212. A plurality of internal electrodes are stacked inside the first main body 212, and each internal electrode is connected to one of the first external terminal 214 and the second external terminal 216. The first external terminal 214 and the second external terminal 216 may also be partially formed on the upper surface, lower surface, front surface, and rear surface of the first main body 212. In this case, the first external terminal 214 and the second external terminal 216 are spaced apart from each other by a predetermined distance so as to face each other on the upper surface, lower surface, front surface, and rear surface of the first main body 212.

The protection device 220 is stacked under the stacked ceramic capacitor 210. The protection device 220 includes a second main body 222, a first external electrode 224 and a second external electrode 226.

The second main body 222 may be formed as a rectangular parallelepiped having an upper surface, a lower surface, a front surface, a rear surface, a left side surface, and a right side surface, and may be formed with various structures of electrode structures for EOS protection. An example is one of a varistor and a TVS diode.

The first external electrode 224 is formed on the left side surface of the second main body 222, and the second external electrode 226 is formed on the right side surface of the second main body 222. In this case, the first external electrode 224 and the second external electrode 226 may also be partially formed on the upper surface, lower surface, front surface, and rear surface of the second main body 222. In this case, the first external electrode 224 and the second external electrode 226 are spaced apart from each other by a predetermined distance so as to face each other on the upper surface, lower surface, front surface, and rear surface of the second main body 222.

As the stacked ceramic capacitor 210 is stacked above the protection device 220, the first external electrode 224 is disposed to face the first external terminal 214. In this case, an area positioned on the lower surface of the first main body 212 among the first external terminals 214 and an area positioned on the upper surface of the second main body 222 among the first external electrodes 224 are disposed to face each other.

In addition, as the stacked ceramic capacitor 210 is stacked above the protection device 220, the second external electrode 226 is disposed to face the second external terminal 216. In this case, an area positioned on the lower surface of the first main body 212 among the second external terminals 216 and an area positioned on the upper surface of the second main body 222 among the second external electrodes 224 are disposed to face each other.

In this case, the stacked ceramic capacitor package 200 for an electronic device according to the second embodiment of the present disclosure may further include a connection electrode connecting the second external terminal 216 and the second external electrode 226.

The first terminal structure 230 is disposed on a left side of a laminate in which the stacked ceramic capacitor 210 and the protection device 220 are stacked. The first terminal structure 230 is disposed to come into contact with the first external terminal 214 and the first external electrode 224. The first terminal structure 230 is disposed to come into contact with the area formed on the left side surface of the first main body 212 among the first external terminals 214, and the area formed on the left side surface of the second main body 222 among the second external electrodes 224.

The second terminal structure 240 is disposed on a right side of the laminate in which the stacked ceramic capacitor 210 and the protection device 220 are stacked. The second terminal structure 240 is disposed to come into contact with the second external terminal 216 and the second external electrode 226. The second terminal structure 240 is disposed to come into contact with an area formed on the right side surface of the first main body 212 among the second external terminals 216, and an area formed on the right side surface of the second main body 222 among the second external electrodes 224.

Meanwhile, the first terminal structure 230 and the second terminal structure 240 are bent inward from under the laminate. That is, a stacked ceramic capacitor package 300 for an electronic device is mounted on a circuit board mounted on a vehicle, and the areas bent toward the inside of the first terminal structure 230 and the second terminal structure 240 are come into contact with terminals formed on the circuit board.

In the first terminal structure 230, a portion of the area disposed under the laminate is bent toward the second terminal structure 240 and comes into contact with terminals formed on the circuit board of the vehicle. In the second terminal structure 240, a portion of the area disposed under the laminate is bent toward the first terminal structure 230 and comes into contact with other terminals formed on the circuit board of the vehicle.

Meanwhile, referring to FIG. 11, when the required EOS withstand voltage characteristics are high, the plurality of stacked ceramic capacitor packages 200 for an electronic device may be mounted side by side on the circuit board.

That is, a first stacked ceramic capacitor package 200a for an electronic device and a first stacked ceramic capacitor package 200b for an electronic device are disposed side by side. The first terminal structures 230 of the first stacked ceramic capacitor package 200a for an electronic device and the first stacked ceramic capacitor package 200b for an electronic device are disposed side by side. The second terminal structures 240 of the first stacked ceramic capacitor package 200a for an electronic device and the first stacked ceramic capacitor package 200b for an electronic device are disposed side by side.

Accordingly, the stacked ceramic capacitor package 200 for an electronic device has a two-row, two-column structure in which two stacked ceramic capacitors 210 are arranged side by side on the upper portion and two protection devices 220 are arranged side by side on the lower portion.

Referring to FIG. 12, the conventional stacked ceramic capacitor 10 has a structure in which a plurality of ceramic capacitors composed of a single product are connected in series. Accordingly, the conventional stacked ceramic capacitor 10 has an EOS withstand voltage of about 700 to 770 when it is composed of one ceramic capacitor, has an EOS withstand voltage of about 1700 to 1800 when two ceramic capacitors are connected in series, and has an EOS withstand voltage of about 2600 to 2800 when three ceramic capacitors are connected in series.

Meanwhile, the stacked ceramic capacitor package 200 for an electronic device according to the second embodiment of the present disclosure has a structure in which ceramic capacitor packages in which a ceramic capacitor and a protection device are stacked are connected in series.

Accordingly, the stacked ceramic capacitor package 200 for an electronic device has an EOS withstand voltage of about 2800 to 3000 when it is composed of one ceramic capacitor package, an EOS withstand voltage of about 2700 to 3000 when two ceramic capacitor packages are connected in series, and has an EOS withstand voltage of about 1800 to 2000 when three ceramic capacitor packages are connected in series.

As such, the stacked ceramic capacitor package 200 for an electronic device according to the second embodiment of the present disclosure has increased EOS withstand voltage characteristics compared to the conventional stacked ceramic capacitor 10.

Referring to FIG. 13, the ceramic capacitor package 200 for an electronic device according to the second embodiment of the present disclosure may be configured to include a first stacked ceramic capacitor 210a, a second stacked ceramic capacitor 210b, a protection device 220, a first stacked ceramic capacitor 210a, and a second terminal structure 240.

In this case, the second stacked ceramic capacitor 210b is stacked under the first stacked ceramic capacitor 210a, and the protection device 220 is stacked under the second stacked ceramic capacitor 210b. The first terminal structure 230 is connected to the first external terminals 214 of the first and second stacked ceramic capacitors 210a and 210b and the first external electrode 224 of the protection device 220, and the second terminal structure 240 is connected to the second external terminals 216 of the first and second stacked ceramic capacitors 210a and 210b and the second external electrode 226 of the protection device 220.

Here, in FIG. 13, the case where two stacked ceramic capacitors 210a and 210b and one protection device 220 are stacked is described as an example, but the present disclosure is not limited thereto, and may also include a laminate in which one stacked ceramic capacitor 210 and two protection devices 220 are stacked.

Referring to FIGS. 14 and 15, the stacked ceramic capacitor package 300 for an electronic device according to the third embodiment of the present disclosure is configured to include a first stacked ceramic capacitor 310, a second stacked ceramic capacitor 320, a first terminal structure 330, and a second terminal structure 340.

The first stacked ceramic capacitor 310 (MLCC) includes a first main body 312 formed in a rectangular parallelepiped having an upper surface, a lower surface, a front surface, a rear surface, a left side surface, and a right side surface, a first external terminal 314 formed on the left side surface of the first main body 312, and a second external terminal 316 formed on the right side surface of the first main body 312.

A plurality of internal electrodes are stacked inside the first main body 312, and each internal electrode is connected to one of the first external terminal 314 and the second external terminal 316. The first external terminal 314 and the second external terminal 316 may also be partially formed on the upper surface, lower surface, front surface, and rear surface of the first main body 312. In this case, the first external terminal 314 and the second external terminal 316 are spaced apart from each other by a predetermined distance so as to face each other on the upper surface, lower surface, front surface, and rear surface of the first main body 312.

The second stacked ceramic capacitor 320 (MLCC) includes a second main body 322 formed in a rectangular parallelepiped having an upper surface, a lower surface, a front surface, a rear surface, a left side surface, and a right side surface, a first external terminal 324 formed on the left side surface of the second main body 322, and a second external terminal 326 formed on the right side surface of the second main body 322.

A plurality of internal electrodes are stacked inside the second main body 322, and each internal electrode is connected to one of the first external terminal 324 and the second external terminal 326. The first external terminal 324 and the second external terminal 326 may also be partially formed on the upper surface, lower surface, front surface, and rear surface of the second main body 322. In this case, the first external terminal 324 and the second external terminal 326 are spaced apart from each other by a predetermined distance so as to face each other on the upper surface, lower surface, front surface, and rear surface of the second main body 322.

The first stacked ceramic capacitor 310 is disposed above the second stacked ceramic capacitor 320. Accordingly, the first external terminals 314 and 324 of the first stacked ceramic capacitor 310 and the second stacked ceramic capacitor 320 are disposed to face each other.

In this case, the area positioned on the lower surface of the first main body 312 among the first external terminals 314 of the first stacked ceramic capacitor 310 and the area positioned on the upper surface of the second main body 322 among the first external terminals 324 of the second stacked ceramic capacitor 320 are disposed to face each other.

In addition, as the first stacked ceramic capacitor 310 is disposed above the second stacked ceramic capacitor 320, the second external terminals 316 and 326 of the first stacked ceramic capacitor 310 and the second stacked ceramic capacitor 320 are also arranged to face each other.

In this case, the area positioned on the lower surface of the first main body 312 among the second external terminals 316 of the first stacked ceramic capacitor 310 and the area positioned on the upper surface of the second main body 322 among the second external terminals 326 of the second stacked ceramic capacitor 320 are disposed to face each other.

In this case, the stacked ceramic capacitor package 300 for an electronic device according to the third embodiment of the present disclosure may further include a connection electrode connecting the second external terminal 316 and 326 of the first stacked ceramic capacitor 310 and the second stacked ceramic capacitor 320.

The first terminal structure 330 is disposed on a left side of a laminate in which the first stacked ceramic capacitor 310 and the second stacked ceramic capacitor 320 are stacked. The first terminal structure 330 is disposed to come into contact with the first external terminals 314 and 324 of the first stacked ceramic capacitor 310 and the second stacked ceramic capacitor 320.

The first terminal structure 330 is disposed to come into contact with an area formed on the left side surface of the first main body 312 among the first external terminals 314 of the first stacked ceramic capacitor 310, and an area formed on the left side surface of the second main body 322 among the first external terminals 324 of the second stacked ceramic capacitor 320.

The second terminal structure 340 is disposed on a right side of a laminate in which the first stacked ceramic capacitor 310 and the second stacked ceramic capacitor 320 are stacked.

The second terminal structure 340 is disposed to come into contact with the second external terminals 316 and 326 of the first stacked ceramic capacitor 310 and the second stacked ceramic capacitor 320.

The second terminal structure 340 is disposed to come into contact with an area formed on the right side surface of the first main body 312 among the second external terminals 316 of the first stacked ceramic capacitor 310, and an area formed on the right side surface of the second main body 322 among the second external terminals 326 of the first stacked ceramic capacitor 320.

Meanwhile, the first terminal structure 330 and the second terminal structure 340 are bent inward from the lower portion of the laminate. The stacked ceramic capacitor package 300 for an electronic device is mounted on a circuit board mounted on a vehicle, and the areas bent toward the inside of the first terminal structure 330 and the second terminal structure 340 are come into contact with terminals formed on the circuit board.

That is, in the first terminal structure 330, a portion of the area disposed under the laminate is bent toward the second terminal structure 340 and comes into contact with terminals formed on the circuit board of the vehicle. In the second terminal structure 340, a portion of the area disposed under the laminate is bent toward the first terminal structure 330 and comes into contact with other terminals formed on the circuit board of the vehicle.

Referring to FIG. 16, in the case of a ferroelectric ceramic capacitor made of an X7R material, it is difficult to have a uniform capacitance value in a wide voltage range due to characteristic A that the effective capacitance decreases when the voltage increases. Accordingly, the effect of reducing the ripple of the power line and reducing the power noise may be reduced.

To solve this problem, there is a solution using the X7T material, which has a smaller rate of change in capacitance than the existing X7R material, but the X7T material also has a problem in that it is difficult to implement uniform capacitance in a wide voltage range due to characteristic B that the effective capacitance decreases when the voltage increases.

In addition, in the case of the paraelectric material such as a COG material or a U2J material having a small rate of change in effective capacitance, there is a problem in that it is difficult to implement high capacitance due to a low dielectric constant.

Accordingly, the stacked ceramic capacitor package 300 for an electronic device 300 according to the embodiment of the present disclosure is implemented in a composite stacked structure such as parallel connection of two or more stacked ceramic capacitors, so the stable effective capacitance characteristics and the high-capacity product are implemented in the environment, where the wide voltage range is required, such as an electric vehicle or hybrid electric vehicle.

To this end, the first stacked ceramic capacitor 310 and the second stacked ceramic capacitor 320 are made of different materials. For example, the first stacked ceramic capacitor 310 is made of a PLZT material, and the second stacked ceramic capacitor 320 is made of an X7T material.

In this case, referring to FIG. 17, the first stacked ceramic capacitor 310 made of the PLZT material has high capacitance characteristic C at a high voltage of about 200V or more. The second stacked ceramic capacitor 320 made of the X7T material has high capacitance characteristic D at a low voltage of less than about 200V.

In this case, the stacked ceramic capacitor package 300 for an electronic device according to the embodiment of the present disclosure implements the first stacked ceramic capacitor 310 and the second stacked ceramic capacitor 320 of different materials in a stacking type, and as a result, different DC bias characteristics of the two products are combined to have a stable effective capacitance E value.

The spirit of the present disclosure has been illustratively described hereinabove. It will be appreciated by those skilled in the art that various modifications and alterations may be made without departing from the essential characteristics of the present disclosure. Accordingly, exemplary embodiments disclosed in the present disclosure are not to limit the spirit of the present disclosure, but are to describe the spirit of the present disclosure. The scope of the present disclosure is not limited to these exemplary embodiments. The scope of the present disclosure should be interpreted by the following claims, and it should be interpreted that all the spirits equivalent to the following claims fall within the scope of the present disclosure.

The invention claimed is:

1. A stacked ceramic capacitor package, comprising:
a stacked ceramic capacitor;
a first terminal structure connected to a first side surface of the stacked ceramic capacitor; and
a second terminal structure connected to a second side surface of the stacked ceramic capacitor and disposed to face the first terminal structure with the stacked ceramic capacitor therebetween,
wherein the first terminal structure has a first groove defined in an area coming into contact with the first side surface of the stacked ceramic capacitors, and
a horizontal length of the first groove is 30% or more to 50% or less of a horizontal length of the stacked ceramic capacitors, and
wherein the first terminal structure includes:
a first horizontal plate disposed on a lower surface of the stacked ceramic capacitor and spaced apart from a lower surface of the stacked ceramic capacitor;

a first vertical plate having a first end portion connected to the first horizontal plate, bent in an upper direction where the stacked ceramic capacitor is disposed, and disposed so that a second end portion is under the stacked ceramic capacitor;

a first extension plate extending upward from a second end portion of the first vertical plate and coming into contact with a first area of the first side surface of the stacked ceramic capacitor; and a second extension plate extending upward from the second end portion of the first vertical plate, spaced apart from the first extension plate, and coming into contact with a second area of the first side surface of the stacked ceramic capacitor, and the first groove is defined as a separation space between the first extension plate and the second extension plate, and is configured to expose a portion of the first side surface of the stacked ceramic capacitor.

2. The stacked ceramic capacitor package of claim 1, wherein a separation distance between the first extension plate and the second extension plate is 30% or more and 50% or less of a length of the second end portion of the first vertical plate.

3. The stacked ceramic capacitor package of claim 1, wherein the first extension plate and the second extension plate include one or more contact protrusions formed on one surface facing the first side surface of the stacked ceramic capacitor.

4. The stacked ceramic capacitor package of claim 1, wherein a vertical length of the first groove exceeds a vertical length of the stacked ceramic capacitor.

5. The stacked ceramic capacitor package of claim 1, wherein the second terminal structure has a second groove defined in an area coming into contact with the second side surface of the stacked ceramic capacitor, and a horizontal length of the second groove is 30% or more to 50% or less of the horizontal length of the stacked ceramic capacitors.

6. The stacked ceramic capacitor package of claim 5, wherein the second terminal structure includes:

a second horizontal plate disposed on a lower surface of the stacked ceramic capacitor and spaced apart from a lower surface of the stacked ceramic capacitor;

a second vertical plate having a first end portion connected to the second horizontal plate, bent in an upper direction where the stacked ceramic capacitor is disposed, and disposed so that a second end portion is under the stacked ceramic capacitor;

a third extension plate extending upward from a second end portion of the second vertical plate and coming into contact with a first area of the second side surface of the stacked ceramic capacitor; and a fourth extension plate extending upward from the second end portion of the second vertical plate, spaced apart from the third extension plate, and coming into contact with a second area of the second side surface of the stacked ceramic capacitor, and the second groove is defined as a separation space between the third extension plate and the fourth extension plate, and is configured to expose a portion of the second side surface of the stacked ceramic capacitor.

7. The stacked ceramic capacitor package of claim 6, wherein a separation distance between the third extension plate and the fourth extension plate is 30% or more and 50% or less of a length of the second end portion of the second vertical plate.

8. The stacked ceramic capacitor package of claim 6, wherein the third extension plate and the fourth extension plate include one or more contact protrusions formed on one surface facing the second side surface of the stacked ceramic capacitor.

9. The stacked ceramic capacitor package of claim 1, further comprising:

a protection element disposed under the stacked ceramic capacitor and having a first side surface coming into contact with the first terminal structure, and a second side surface coming into contact with the second terminal structure.

10. The stacked ceramic capacitor package of claim 9, wherein the protection element is one of a varistor and a TVS diode.

11. The stacked ceramic capacitor package of claim 9, further comprising:

a first external terminal disposed on the first side surface of the stacked ceramic capacitor and a connection electrode connected to the first external electrode disposed on the first side surface of the protection element.

12. The stacked ceramic capacitor package of claim 1, wherein the stacked ceramic capacitor includes:

a first stacked ceramic capacitor made of a first material and having a first side surface coming into contact with the first terminal structure and a second side surface coming into contact with the second terminal structure; and a second stacked ceramic capacitor made of a second material, disposed under the first stacked ceramic capacitor, and having a first side surface coming into contact with the first terminal structure and a second side surface coming into contact with the second terminal structure.

13. The stacked ceramic capacitor package of claim 12, wherein the first material is one of an X7T material and a PLZT material, and the second material is the other of the X7T material and the PLZT material.

14. The stacked ceramic capacitor package of claim 12, further comprising:

a connection electrode externally connecting a second external terminal of the first stacked ceramic capacitor and a second external electrode of the first stacked ceramic capacitor.

* * * * *